(12) United States Patent
Kim

(10) Patent No.: US 7,956,434 B2
(45) Date of Patent: Jun. 7, 2011

(54) IMAGE SENSOR AND METHOD FOR MANUFACTURING THE SAME

(75) Inventor: Tae-Gyu Kim, Masan-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 150 days.

(21) Appl. No.: 12/344,502

(22) Filed: Dec. 27, 2008

(65) Prior Publication Data
US 2009/0174024 A1   Jul. 9, 2009

(30) Foreign Application Priority Data

Dec. 27, 2007  (KR) .................. 10-2007-0139370
Feb. 15, 2008  (KR) .................. 10-2008-0013849

(51) Int. Cl.
*H01L 27/146*   (2006.01)
*H01L 21/00*   (2006.01)

(52) U.S. Cl. ......... 257/443; 257/E27.133; 257/E21.002; 438/73

(58) Field of Classification Search .................. 257/213, 257/288, 290–294, 414, 428, 431–466, E21.001, 257/E21.002, E27.133–E27.14; 438/57–98
See application file for complete search history.

(56) References Cited

U.S. PATENT DOCUMENTS

| 7,495,206 B2* | 2/2009 | Park ............................ 250/214.1 |
| 2005/0029643 A1 | 2/2005 | Koyanagi |
| 2009/0065829 A1* | 3/2009 | Kim .............................. 257/292 |

* cited by examiner

*Primary Examiner* — Minh-Loan T Tran
*Assistant Examiner* — Kevin Quinto
(74) *Attorney, Agent, or Firm* — Sherr & Vaughn, PLLC

(57) ABSTRACT

Embodiments relate to an image sensor and a method of manufacturing the same. According to embodiments, an image sensor may include a first substrate having circuitry formed thereon. It may further include a photodiode bonded to the first substrate and electrically connected to the circuitry, and a contact plug at a pixel border that may be electrically connected with the circuitry and the photodiode. According to embodiments, the photodiode may include a first conductive type ion implantation region selectively provided in a crystalline semiconductor layer, and a second conductive type ion implantation region in contact with one side surface of the first conductive type ion implantation region.

16 Claims, 7 Drawing Sheets

IMAGE SENSOR AND METHOD FOR MANUFACTURING THE SAME

Figure 1A:
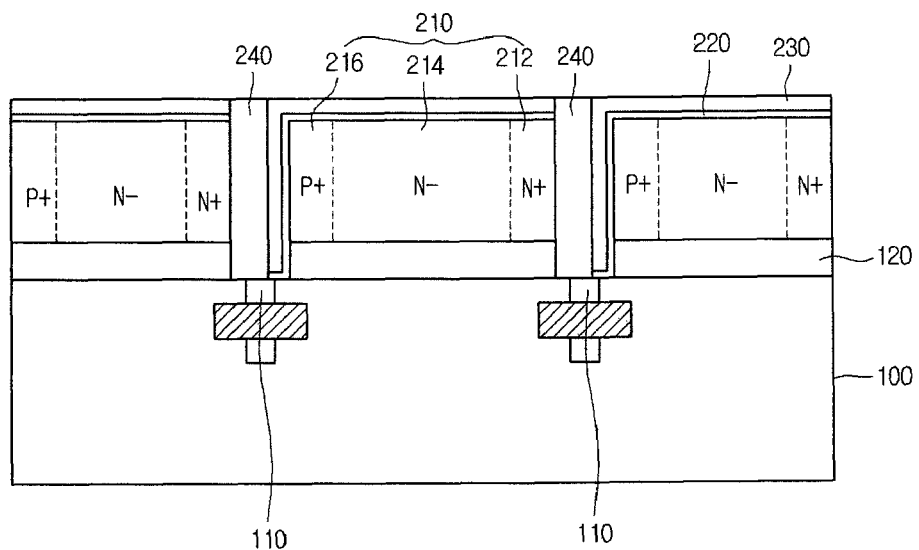

The present application claims priority under 35 U.S.C. 119 to Korean Patent Application No. 10-2007-0139370, filed Dec. 27, 2007, which is hereby incorporated by reference in their entirety.

BACKGROUND

A complementary metal oxide semiconductor (CMOS) image sensor may have a photodiode and a metal oxide semiconductor (MOS) transistor formed in a unit pixel. A CMOS image censor may sequentially detect an electrical signal of each unit pixel through switching to produce an image.

A related art CMOS image sensor may be configured with a horizontally disposed photodiode and transistor. A related art horizontally disposed CMOS image sensor may overcome various limitations of a charge-coupled device (CCD) image sensor. The related art horizontal CMOS sensor, however, still has limitations.

For example, a related art horizontal CMOS image sensor may be manufactured with a photodiode and transistor disposed in mutual horizontal positions and proximity. Accordingly, when additional space for a photodiode is required, a fill factor region should be reduced, and limits may be imposed on resolution potential.

In addition, it may be difficult to attain ideal conditions for simultaneous production of photodiodes and transistors for a related art horizontal CMOS image sensor.

Further, in a horizontal CMOS image sensor according to the related art, a resolution of an image sensor may be reduced when a pixel size increases, and sensitivity of the image sensor may be reduced when an area of the photodiode is reduced.

SUMMARY

Embodiments relate to image sensors. Embodiments relate to image sensors and methods for manufacturing image sensors that may provide a vertical integration of circuitry and photodiodes.

Embodiments further relate to image sensors and methods for manufacturing image sensors that may have both improved resolution and sensitivity. According to embodiments, an image sensor may include vertically configured photodiodes with improved physical and electrical contact between photodiodes and circuitry.

Embodiments also relate to image sensors that may use vertically configured photodiodes, and methods for manufacturing such image sensors. This may reduce or prevent defects in photodiodes.

According to embodiments, an image sensor may include at least one of the following components. A first substrate with circuitry formed thereon. A photodiode bonded to the first substrate and electrically connected to the circuitry. A contact plug at a pixel border and electrically connected with the circuitry and the photodiode. The photodiode may include a first conductive type ion implantation region selectively provided in a crystalline semiconductor layer, and a second conductive type ion implantation region in contact with one side surface of the first conductive type ion implantation region.

According to embodiments, a method for manufacturing an image sensor may include at least one of the following steps. Preparing a first substrate provided with circuitry with wiring. Preparing a second substrate provided with a photodiode. Bonding the first substrate and the second substrate to contact the photodiode and a first dielectric. Exposing the photodiode through removing a lower side of the bonded second substrate. Providing a contact plug at a pixel boundary to electrically connect the wiring and the photodiode. The photodiode may include a first conductive type ion implantation region selectively provided in a crystalline semiconductor layer, and a second conductive type ion implantation region in contact with one side surface of the first conductive type ion implantation region.

DRAWINGS

Figure 1B:
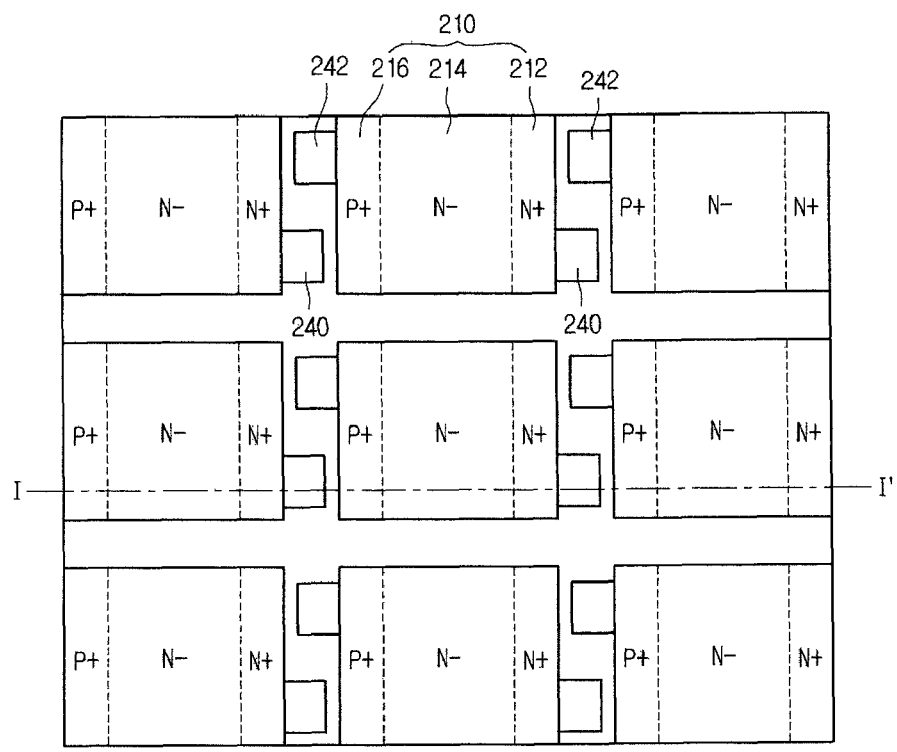

Example FIGS. 1A and 1B are a sectional view and a plan view illustrating an image sensor according to embodiments.

Example FIGS. 2 to 13 are sectional views illustrating methods for manufacturing an image sensor according to embodiments.

DESCRIPTION

Hereinafter, image sensors and methods for manufacturing image sensors according to embodiments will be described with reference to the drawings. FIG. 1B is a plan view of an image sensor according to embodiments, and FIG. 1A is a sectional view of the image sensor illustrated in FIG. 1B taken along line I-I'.

An image sensor according to embodiments may include first substrate 100 with circuitry formed thereon and photodiode 210 bonded to first substrate 100 and electrically connected to the circuitry It may also include contact plug 240 formed at a pixel border to electrically connect with the circuitry and photodiode 210. Photodiode 210 may include first conductive type ion implantation region 214 formed selectively in a crystalline semiconductor layer, and second conductive type ion implantation region 216 formed in contact with one side surface of first conductive type ion implantation region 214.

As shown in FIG. 1A, according to embodiments, one side surface of contact plug 240 may electrically contact first conductive type ion implantation region 214 of the photodiode, and another side surface of contact plug 240 may be insulated by second dielectric 230.

According to embodiments, barrier layer 220 may be further formed on and/or over a side surface of second dielectric 230. According to embodiments, second dielectric 230 may be an oxide layer, and barrier layer 220 may be a nitride layer. Other materials may also be suitable, however, as are known in the art.

According to embodiments, first dielectric 120 may be formed between approximately 50 Å and 1,000 Å in thickness and may be formed between first substrate 100 and photodiode 210. First dielectric 120 may function as a coupling layer for first substrate 100 and second substrate 200 (see e.g. FIG. 5).

Also, according to embodiments, high concentration first conductive type ion implantation region 212 may be further included between first conductive type ion implantation region 214 of the photodiode and contact plug 240.

Referring to FIG. 1B, according to embodiments, upper electrode 242 may be electrically connected to second conductive type ion implantation region 216 of the photodiode.

According to embodiments, semiconductor layer 210a (FIG. 3) may be a monocrystalline semiconductor layer, but could be any suitable material known in the art. According to embodiments, semiconductor layer 210a may be a polycrystalline semiconductor layer.

According to embodiments, the circuitry of first substrate 100 for CMOS image sensors (CIS) may be a 4 transistor CIS (4 Tr CIS). According to embodiments, the circuitry of first substrate 100 may also be a 1 Tr CIS, a 3 Tr CIS, a 5 Tr CIS, a shared transistor CIS (1.5 Tr CIS), or any other configuration known in the art.

According to embodiments, wiring 110 formed on and/or over first substrate 100 may include metal and plugs. The uppermost portion of wiring 110 may function as the lower electrode of the photodiode.

According to embodiments, as shown in FIGS. 1A and 1B, a fill factor may be increased by forming a contact plug and upper electrode at a pixel boundary.

Also, according to embodiments, cross-talk of pixels may be minimized or prevented by forming a dielectric at the pixel boundary. Additionally, according to embodiments, ohmic contact may be increased through securing the contact between the contact plug and the lower wiring at the pixel boundary. Embodiments may also provide a photodiode formed on a side surface within a crystalline semiconductor disposed above the circuitry.

Example FIGS. 2 to 13 are sectional views illustrating methods for manufacturing an image sensor according to embodiments.

Figure 2:
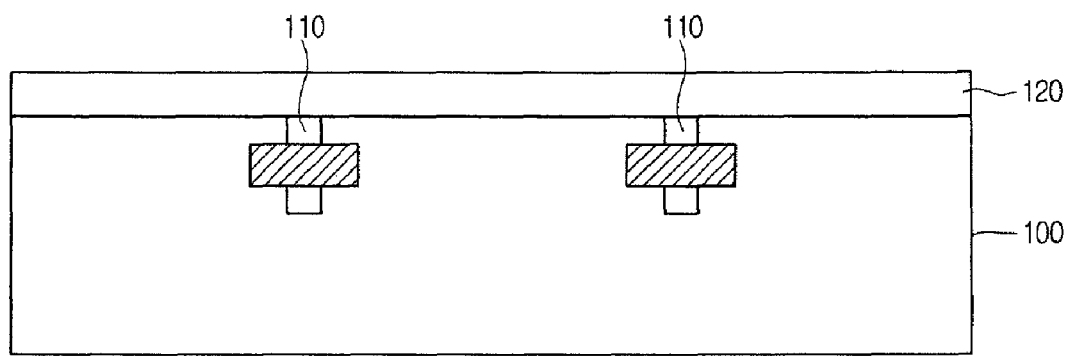

Referring to FIG. 2, first substrate 100 may be prepared on and/or over which circuitry, which may include wiring 110, is formed. According to embodiments, the circuitry may be of any configuration known in the art. For example, the circuitry may be a 4 Tr CIS. Wiring 110 formed on and/or over first substrate 100 may include metal and plugs.

First dielectric 120 may be formed on and/or over first substrate 100 to selectively contact wiring 110. According to embodiments, forming first dielectric 120 is not a required process. First dielectric 120 may be an oxide layer such as silicon oxide ($SiO_2$), but is not limited thereto. Planarization, such as chemical mechanical polishing (CMP), may be performed on first dielectric 120.

According to embodiments, a dielectric may be interposed between the photodiode and circuitry. This may increase connectivity between the photodiode and circuitry in a vertically configured photodiode. Also, according to embodiments, after a dielectric is formed on and/or over the circuitry and planarization, such as CMP is performed, bonding may be performed. This may minimize overlay errors and improve bonding and cleaving states.

Figure 3:
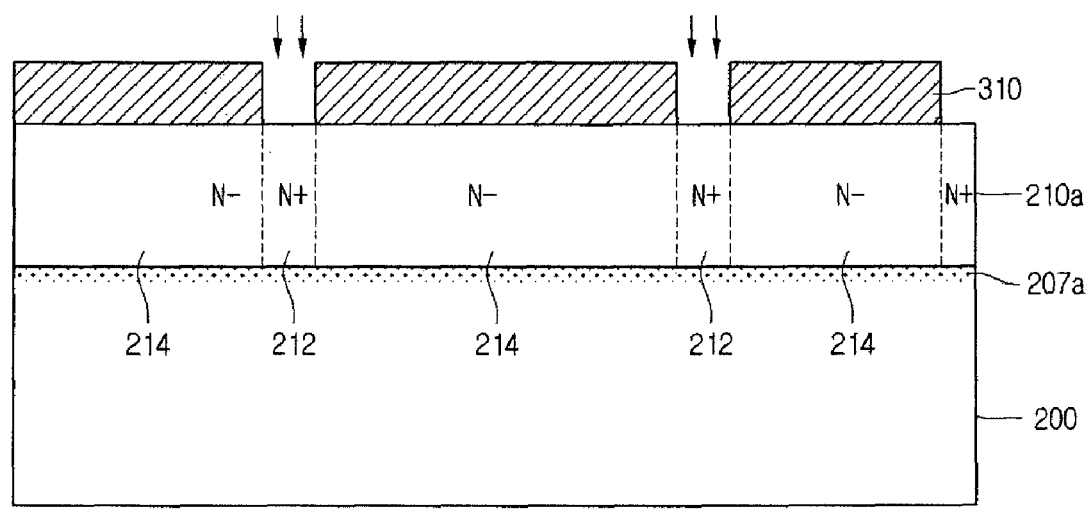

Referring to FIG. 3, semiconductor layer 210a, which may be crystalline, may be formed on and/or over second substrate 200. By forming a photodiode on such a crystalline semiconductor layer 210a, defects in the photodiode may be minimized or prevented.

According to embodiments, crystalline semiconductor layer 210a may be epitaxially formed on and/or over second substrate 200. Hydrogen ions may then be implanted at the boundary between second substrate 200 and crystalline semiconductor layer 210a. This may form hydrogen ion implantation layer 207a.

Photodiode 210 may be formed through ion implantation on crystalline semiconductor layer 210a. According to embodiments, crystalline semiconductor layer 210a may be formed as a first conductive type layer. After forming crystalline semiconductor layer 210a, a first conductive type ion implantation may be performed on and/or over the entire surface. According to embodiments, after crystalline semiconductor layer 210a is formed, a mask may be used to selectively form first conductive type ion implantation region 214. According to embodiments, first conductive type ion implantation region 214 may be an N− region, but is not limited thereto.

First photosensitive layer pattern 310 may be used as a mask to form a high concentration first conductive type ion implantation region 212 on the pixel boundary at one side of first conductive type ion implantation region 214. According to embodiments, by forming an N+ region on the pixel boundary, ohmic contact can be induced.

Figure 4:
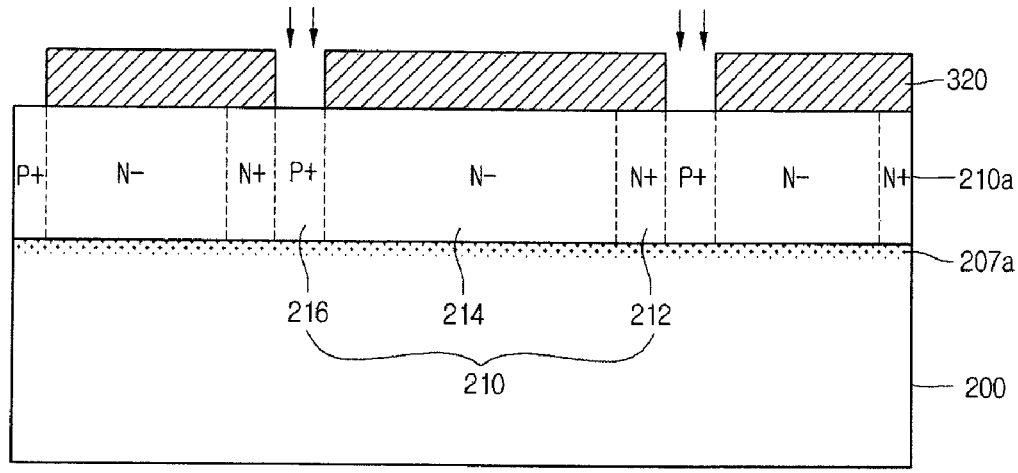

Referring to FIG. 4, first photosensitive layer pattern 310 may be removed, and second photosensitive layer pattern 320 may be used as a mask to form second conductive type ion implantation layer 216 on another side surface of first conductive type ion implantation region 214.

Figure 5:
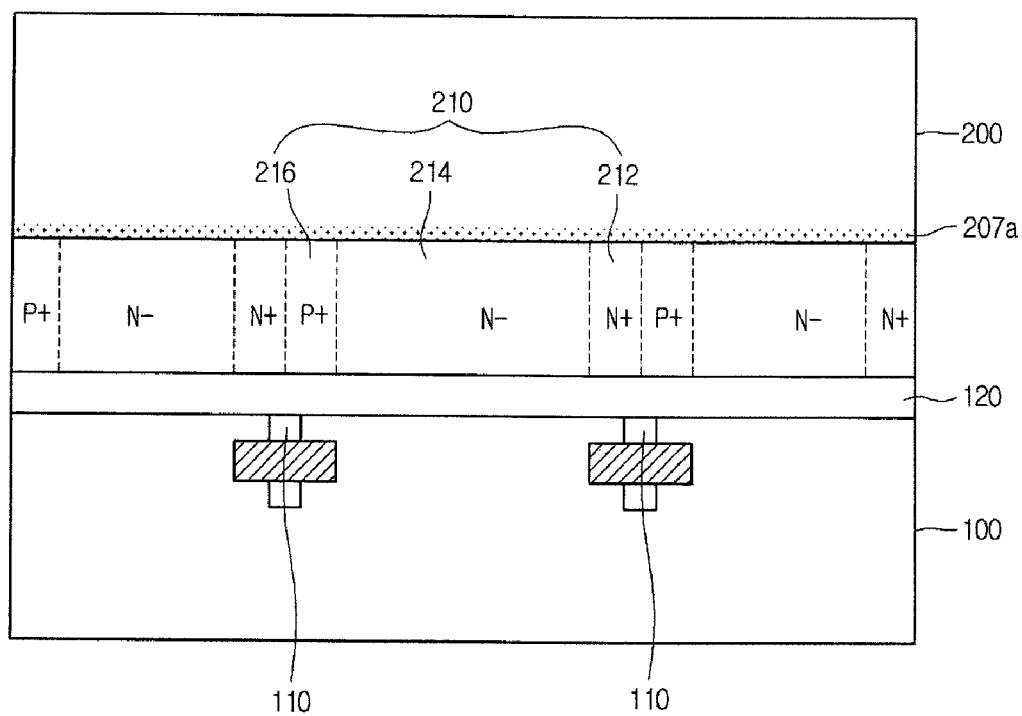

Referring to FIG. 5, first substrate 100 and second substrate 200 may be bonded to contact photodiode 210 with first dielectric 120. According to embodiments, before first substrate 100 and second substrate 200 are bonded, plasma activation may be used to raise the surface energy of the surfaces to be bonded.

Figure 6:
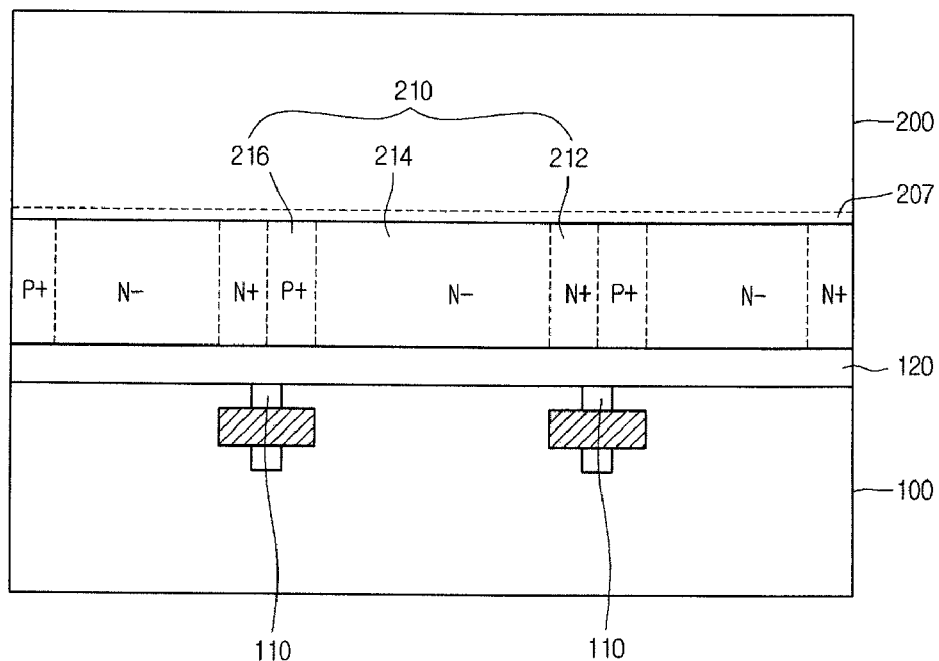
Figure 7:
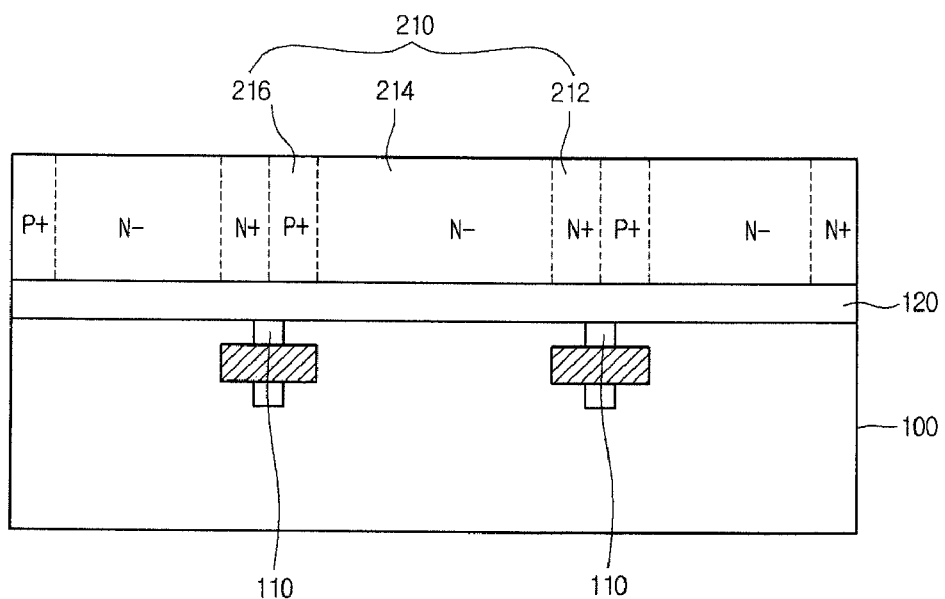

Referring to FIG. 6, second substrate 200 may be heat treated. This may convert hydrogen ion implantation layer 207a (FIG. 5) to a hydrogen gas layer 207. Next, with reference to FIG. 7, photodiode 210 may be exposed by removing a bottom of second substrate 200 above the hydrogen gas layer 207.

Figure 8:
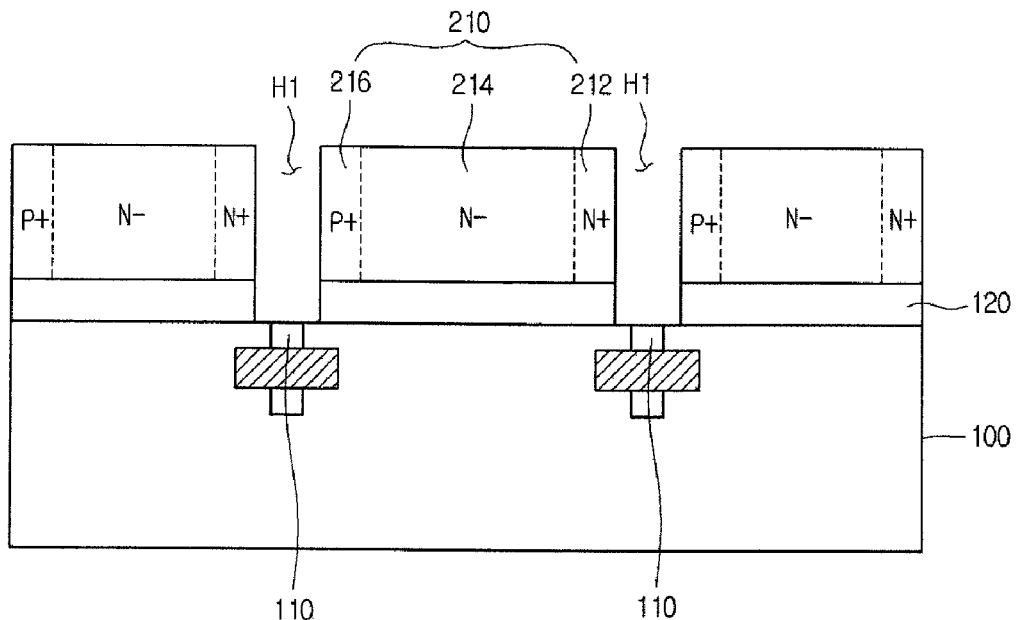

Referring to FIG. 8, etching may be performed to define photodiode 210 into individual pixels. According to embodiments, photodiode 210 and first dielectric 120 at the pixel boundary may be removed to selectively expose wiring 110 and form a first contact hole H1. According to embodiments, high concentration first conductive type ion implantation region 212 and second conductive type ion implantation region 216 at the pixel boundary may be selectively and partially removed to selectively expose wiring 110.

Figure 9:
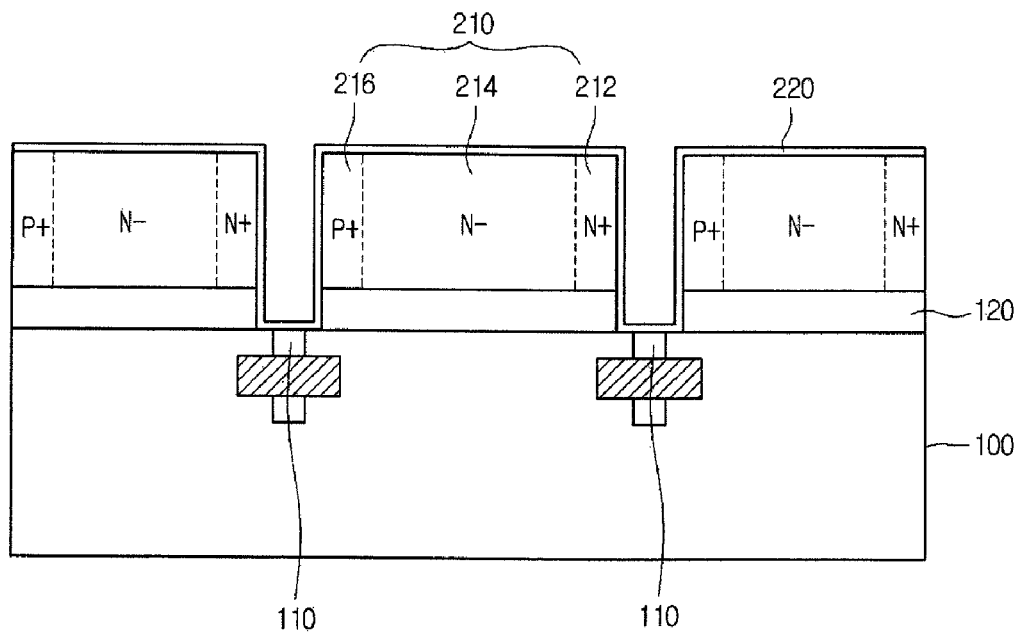

Referring to FIG. 9, barrier layer 220 may be formed on/over first contact hole H1 and photodiode 210. Barrier layer 220 may be a nitride layer such as a silicon nitride (SiN) layer, but is not limited thereto.

Figure 10:
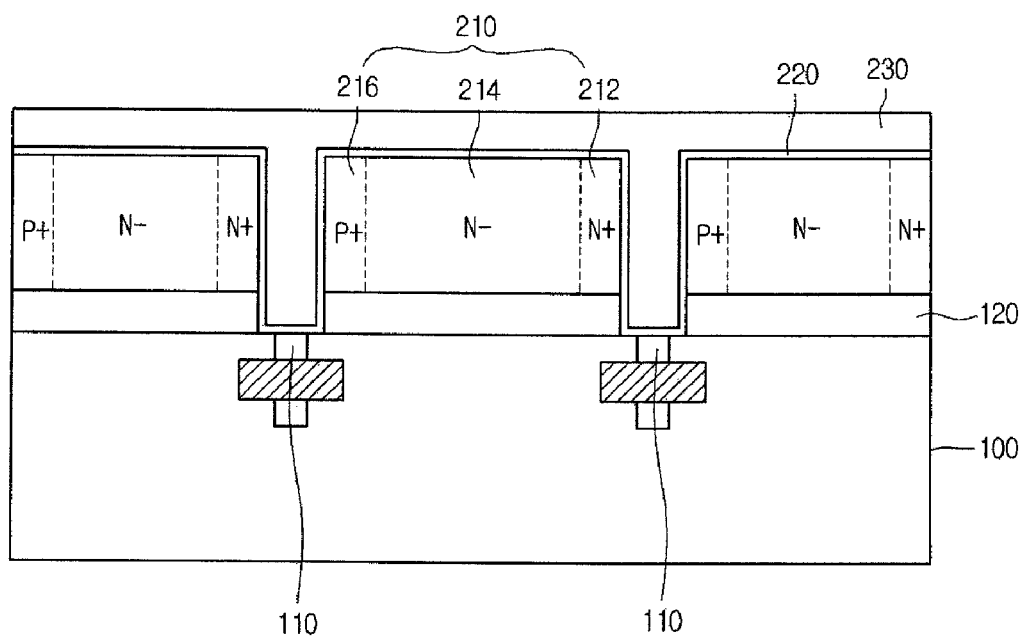

Referring to FIG. 10, second dielectric 230 may be formed to fill first contact hole H1 on and/or over barrier layer 220. Second dielectric 230 may be an oxide layer such as $SiO_2$, but is not limited thereto.

Figure 11:
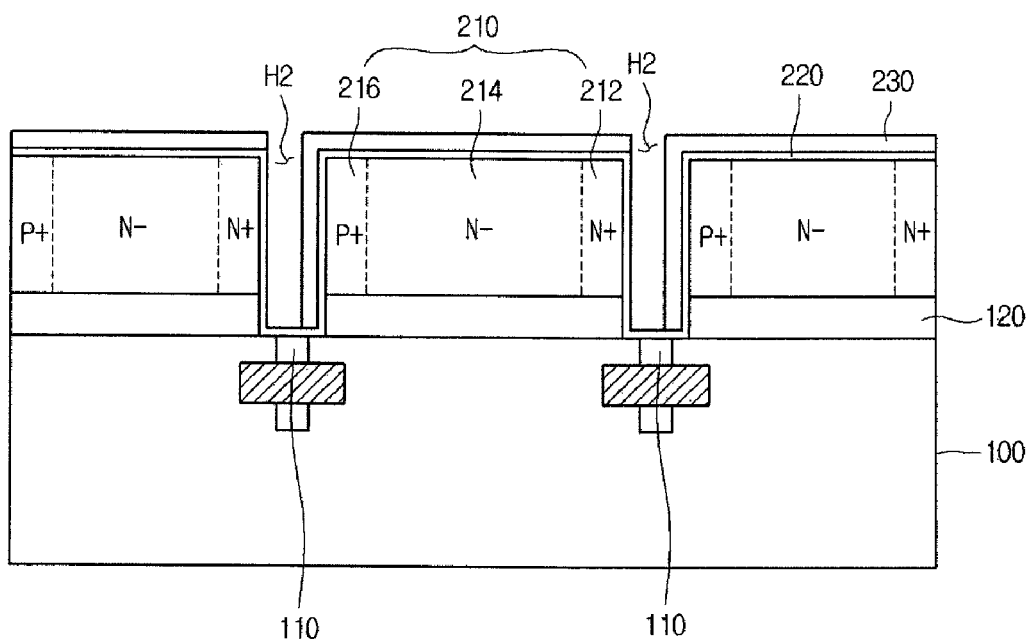

Referring to FIG. 11, second dielectric 230 may be removed to expose barrier layer 220 on one side surface and a side at a bottom surface of first contact hole H1 and form second contact hole H2. According to embodiments, a first wet etch, using an etchant with a high etch selectivity, may be performed on second dielectric 230 and the barrier layer.

Figure 12:
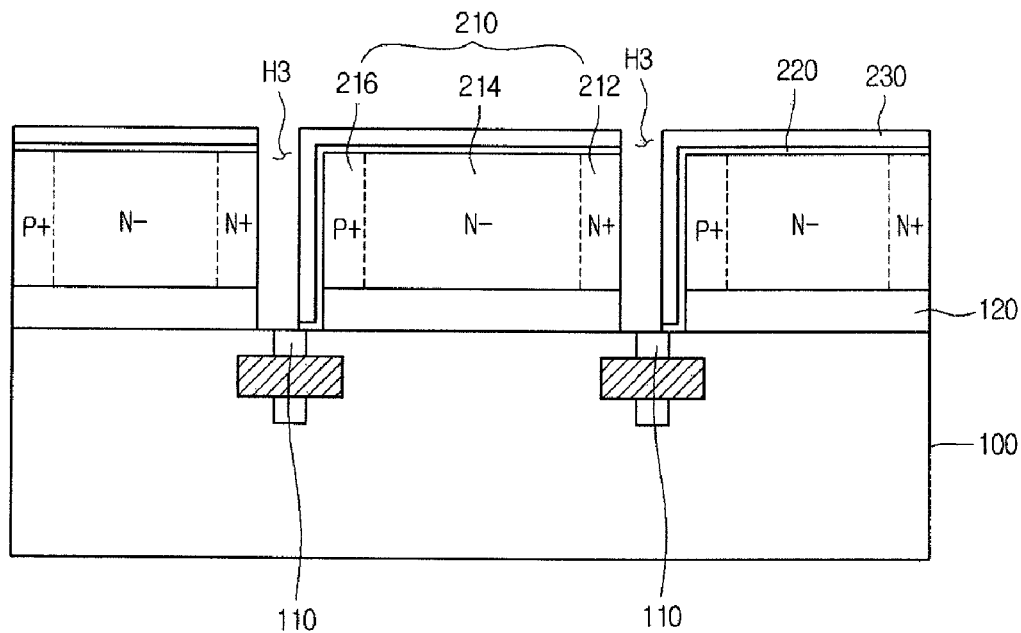

Referring to FIG. 12, exposed barrier layer 220 may be removed. This may form third contact hole H3 to selectively expose a side surface of photodiode 210 and wiring 110. According to embodiments, a second wet etch, using an etchant with a high etch selectivity, may be performed on second dielectric 230 and the barrier layer. According to embodiments, the exposed barrier layer 220 may be removed to form third contact hole H3 to selectively expose a side surface of the first conductive type ion implantation region 212 and wiring 110.

According to embodiments, by using a wet etch when forming the contact, plasma damage that may otherwise occur in dry etching can be minimized or prevented. This may result in more favorable characteristics of the photodiode as compared to the related art.

Figure 13:
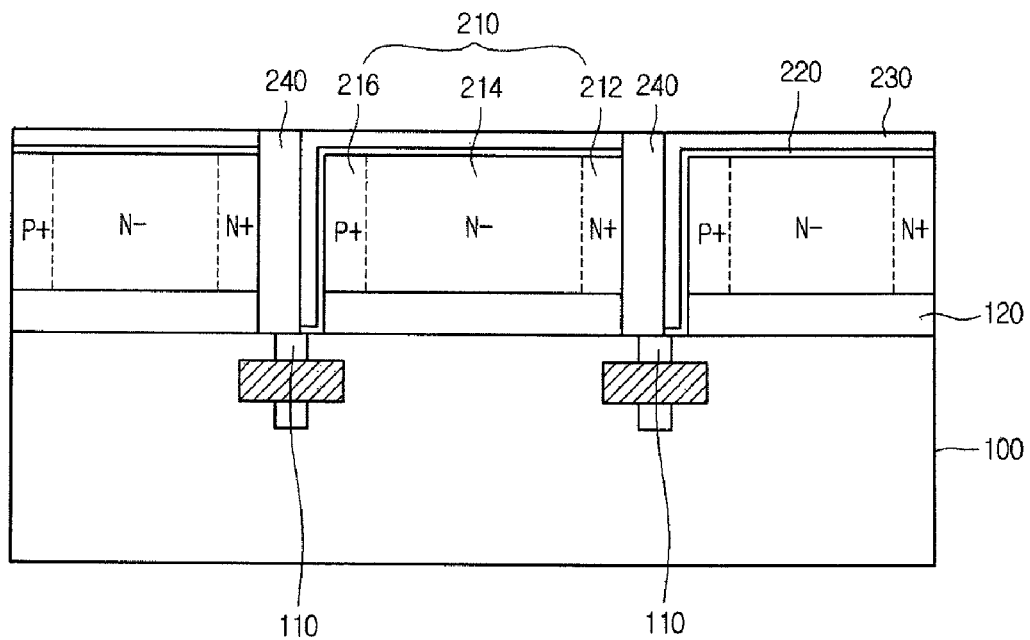

Referring to FIG. 13, a contact plug 240 may be formed to fill third contact hole H3. According to embodiments, contact plug 240 may be formed of tungsten (W), a single Ti layer, or a Ti/TiN multilayer, but is not limited thereto. An upper electrode 242 that may electrically contact second conductive type ion implantation region 216 may next be formed. According to embodiments, after selectively removing the pixel boundary to expose a side surface of second conductive type ion implantation region 216, upper electrode 242 may be formed to contact the second conductive ion implantation region 216.

An etch process to form upper electrode 242 may be preformed together with an etch process to form contact plug 240. According to embodiments, the materials used to form contact plug 240 and upper electrode 242 may be the same material. According to embodiments, a fourth hole may be formed. The fourth hole may expose second conductive type ion implantation region 216 during formation of third hole H3 exposing high concentration first conductive type ion implantation region 212, the contact plug and upper electrode may be formed simultaneously to fill third hole H3 and a fourth hole.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
   a first substrate with circuitry formed thereon;
   a photodiode bonded to the first substrate and electrically connected to the circuitry, the photodiode comprising a first conductive type ion implantation region selectively provided in a crystalline semiconductor layer, and a second conductive type ion implantation region in contact with one side surface of the first conductive type ion implantation region;
   a contact plug at a pixel border and electrically connected with the circuitry and the photodiode, wherein a first side surface of the contact plug is electrically contacted with the first conductive type ion implantation region of the photodiode, and a second side surface of the contact plug is insulated by a dielectric; and
   an upper electrode electrically contacting the second conductive type ion implantation region of the photodiode.

2. The device of claim 1, wherein the circuitry comprises one of a 1 transistor CMOS image sensor, a 2 transistor CMOS image sensor, a 3 transistor CMOS image sensor, and a 4 transistor CMOS image sensor.

3. The device of claim 1, comprising a high concentration first conductive type ion implantation region between the first conductive type ion implantation region and the contact plug.

4. The device of claim 1, comprising a high concentration first conductive type ion implantation region between the first conductive type ion implantation region and the contact plug.

5. The device of claim 1, wherein the contact plug comprises at least one of tungsten, a single layer of titanium, and a titanium/titanium nitride (Ti/TiN) multilayer structure.

6. A method, comprising:
   preparing a first substrate including circuitry and wiring;
   preparing a second substrate including a photodiode;
   bonding the first substrate and the second substrate to contact the photodiode and a first dielectric;
   exposing the photodiode by removing a lower side of the second substrate; and
   electrically connecting the wiring to the photodiode,
   wherein the photodiode comprises a first conductive type ion implantation region selectively provided in a crystalline semiconductor layer, and a second conductive type ion implantation region in contact with one side surface of the first conductive type ion implantation region,
   wherein electrically connecting the wiring to the photodiode comprises forming a contact plug at a pixel boundary, and
   wherein a first side surface of the contact plug is electrically contacted with the first conductive type ion implantation region of the photodiode, and a second side surface of the contact plug is insulated by a second dielectric.

7. The method of claim 6, wherein the crystalline semiconductor layer comprises a monocrystalline semiconductor layer.

8. The method of claim 6, wherein the circuitry comprises one of a 1 transistor CMOS image sensor, a 2 transistor CMOS image sensor, a 3 transistor CMOS image sensor, and a 4 transistor CMOS image sensor.

9. The method of claim 6, comprising providing an upper electrode electrically coupled to the second conductive type ion implantation region.

10. The method of claim 6, comprising forming the first dielectric on the first substrate to selectively contact the wiring, after preparing the first substrate.

11. The method of claim 10, wherein the wiring is electrically coupled to the photodiode by a contact plug formed at a pixel boundary, and a first side surface of the contact plug is electrically coupled to the first conductive type ion implantation region, and a second side surface of the contact plug is insulated by a second dielectric.

12. The method of claim 10, wherein electrically connecting the wiring and the photodiode comprises:
   defining a first contact hole to selectively expose the wiring by removing the photodiode and the first dielectric at a pixel boundary;
   forming a barrier layer over the first contact hole and the photodiode;
   providing a second dielectric over the barrier layer to fill the first contact hole;
   defining a second contact hole by removing the second dielectric to expose the barrier layer at a side surface and a side at a bottom surface of the first contact hole;
   defining a third contact hole by removing the exposed barrier layer and selectively exposing a side surface of the photodiode and the wiring; and
   forming a contact plug to fill the third contact hole.

13. The method of claim 12, wherein the barrier layer comprises a silicon nitride (SIN) layer.

14. The method of claim 12, wherein removing the photodiode and the first dielectric, at the pixel boundary comprises performing a wet etch.

15. The method of claim 12, wherein defining the first, second, and third contact holes comprises performing a wet etch.

16. The method of claim 12, wherein the contact plug comprises at least one of tungsten, a single layer of titanium, and a titanium/titanium nitride (Ti/TiN) multilayer structure.

* * * * *